United States Patent
Schulze et al.

(10) Patent No.: US 9,209,292 B2
(45) Date of Patent: Dec. 8, 2015

(54) CHARGE COMPENSATION SEMICONDUCTOR DEVICES

(71) Applicant: Infineon Technologies Austria AG, Villach (AT)

(72) Inventors: Hans-Joachim Schulze, Taufkirchen (DE); Franz-Josef Niedernostheide, Muenster (DE); Anton Mauder, Kolbermoor (DE); Joachim Weyers, Hoehenkirchen (DE); Franz Hirler, Isen (DE); Markus Schmitt, Neubiberg (DE); Armin Willmeroth, Ausburg (DE); Björn Fischer, Munich (DE); Stefan Gamerith, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/081,413

(22) Filed: Nov. 15, 2013

(65) Prior Publication Data

US 2015/0021670 A1 Jan. 22, 2015

Related U.S. Application Data

(63) Continuation-in-part of application No. 13/945,226, filed on Jul. 18, 2013, now abandoned.

(51) Int. Cl.
| | |
|---|---|
| *H01L 29/76* | (2006.01) |
| *H01L 29/78* | (2006.01) |
| *H01L 29/66* | (2006.01) |
| *H01L 29/06* | (2006.01) |
| *H01L 29/10* | (2006.01) |

(52) U.S. Cl.
CPC .......... *H01L 29/78* (2013.01); *H01L 29/0634* (2013.01); *H01L 29/0696* (2013.01); *H01L 29/1095* (2013.01); *H01L 29/66712* (2013.01); *H01L 29/7811* (2013.01)

(58) Field of Classification Search
CPC . H01L 29/78; H01L 29/0878; H01L 29/0634; H01L 29/7811; H01L 29/66712; H01L 29/0696; H01L 29/1095
See application file for complete search history.

(56) References Cited

U.S. PATENT DOCUMENTS

| | | | |
|---|---|---|---|
| 7,002,205 B2 | 2/2006 | Onishi et al. | |
| 2007/0040217 A1* | 2/2007 | Saito et al. | 257/341 |

(Continued)

FOREIGN PATENT DOCUMENTS

DE 10066053 B4 3/2006

*Primary Examiner* — A. Sefer
(74) *Attorney, Agent, or Firm* — Murphy, Bilak & Homiller, PLLC

(57) ABSTRACT

A field-effect semiconductor device includes a semiconductor body having a first surface and an edge, an active area, and a peripheral area between the active area and the edge, a source metallization on the first surface and a drain metallization. In the active area, first conductivity type drift portions alternate with second conductivity type compensation regions. The drift portions contact the drain metallization and have a first maximum doping concentration. The compensation regions are in Ohmic contact with the source metallization. The peripheral area includes a first edge termination region and a second semiconductor region in Ohmic contact with the drift portions having a second maximum doping of the first conductivity type which lower than the first maximum doping concentration by a factor of ten. The first edge termination region of the second conductivity type adjoins the second semiconductor region and is in Ohmic contact with the source metallization.

20 Claims, 7 Drawing Sheets

(56) References Cited

U.S. PATENT DOCUMENTS

| | | | |
|---|---|---|---|
| 2007/0132012 A1* | 6/2007 | Saito | 257/327 |
| 2007/0138543 A1* | 6/2007 | Saito | 257/328 |
| 2007/0272979 A1* | 11/2007 | Saito et al. | 257/335 |
| 2008/0237701 A1* | 10/2008 | Willmeroth et al. | 257/328 |
| 2008/0315297 A1 | 12/2008 | Takashita et al. | |
| 2012/0061721 A1* | 3/2012 | Kimura et al. | 257/133 |
| 2012/0074491 A1* | 3/2012 | Ohta et al. | 257/334 |

\* cited by examiner

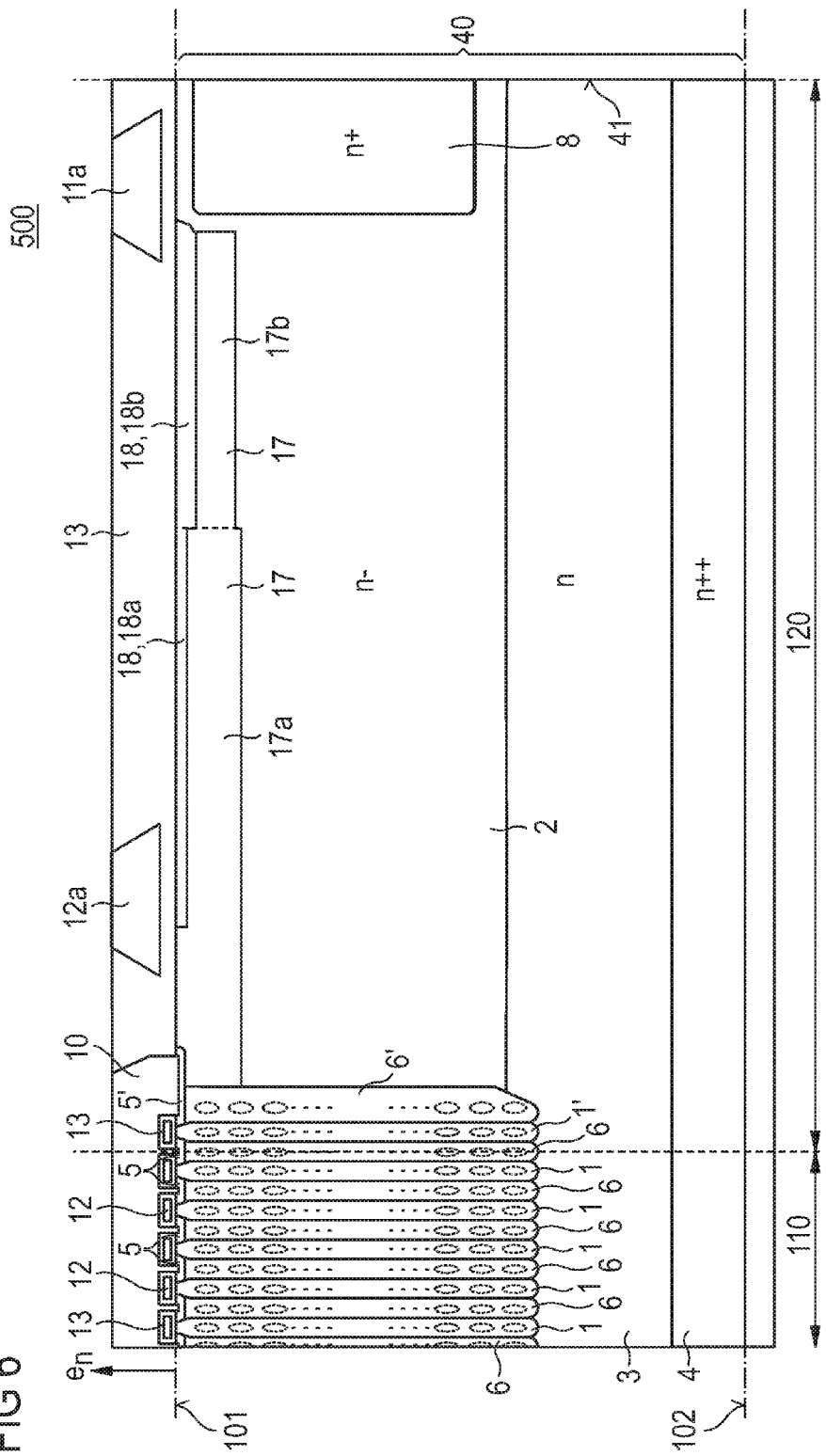

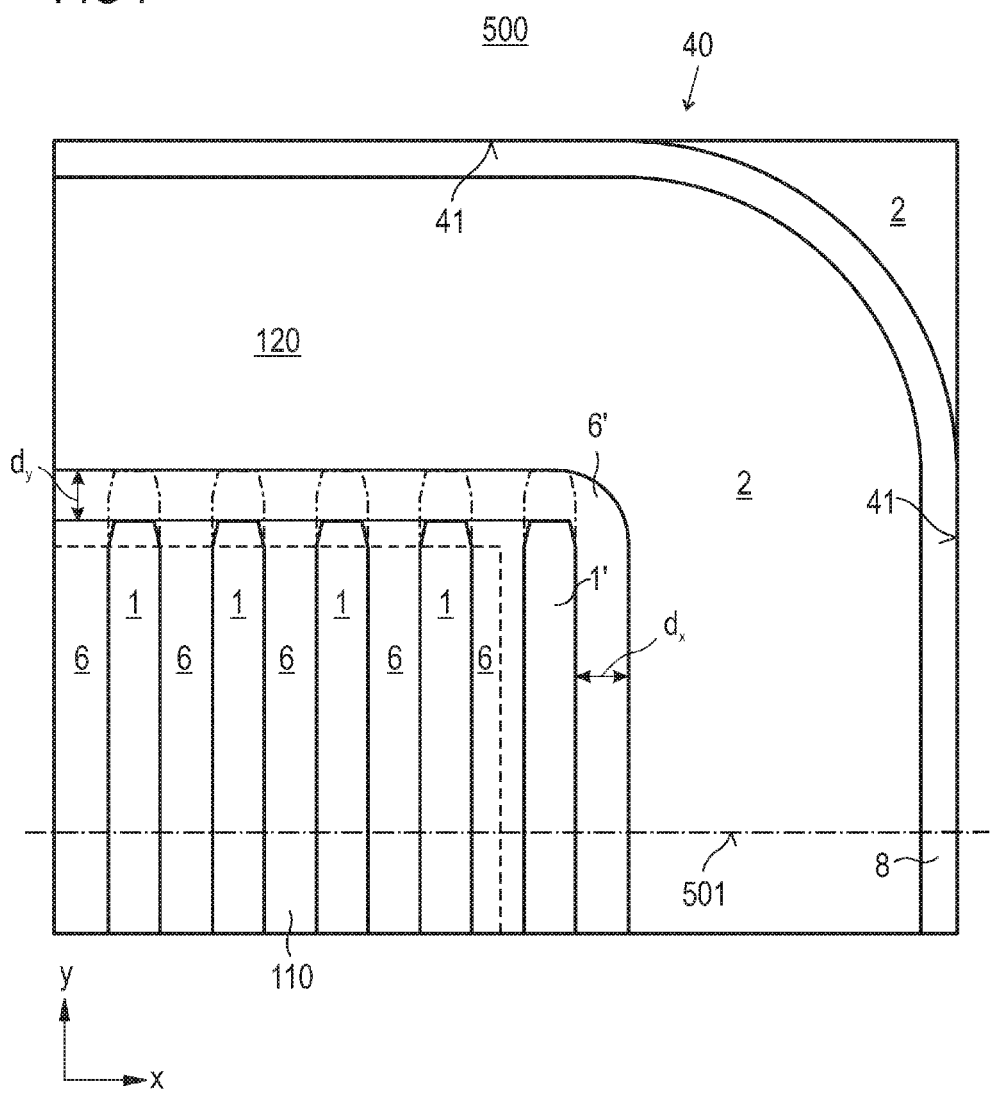

CHARGE COMPENSATION SEMICONDUCTOR DEVICES

PRIORITY CLAIM

This application is a Continuation-In-Part (CIP) of U.S. patent application Ser. No. 13/945,226 filed on 18 Jul. 2013, the content of said application incorporated herein by reference in its entirety.

TECHNICAL FIELD

Embodiments of the present invention relate to semiconductor devices having a charge compensation structure, in particular to power semiconductor field-effect transistors having a charge compensation structure and an edge-termination structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, high robustness and/or good softness are often desired.

To achieve low on-state resistance Ron and high breakdown voltages $U_{bd}$, compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge compensation structure remain "cool" compared with conventional semiconductor power devices.

Meanwhile, switching losses of power semiconductor devices have become more important. Depending on device operation, output charge $Q_{OSS}$ (or output capacitance $C_{OSS}$) and switching losses $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$ when significant parts of the stored charge $Q_{oss}$ are removed at high voltages across load terminals of the power semiconductor device. In addition to enable blocking, the output charge $Q_{OSS}$ (at specific blocking voltage) has to be completely removed, which results in switching delays.

To achieve high breakdown voltages $U_{bd}$, an edge-termination structure may be used in a peripheral area surrounding the active area with active MOSFET-cells. However, the peripheral area requires chip area and thus increases costs. Further, the edge-termination structure may substantially contribute to the output charge $Q_{OSS}$ and output capacitance $C_{OSS}$, respectively, for example to more than 10% of the total output capacitance $C_{OSS}$.

Accordingly, there is a need to improve semiconductor devices with charge compensation structures.

SUMMARY

According to an embodiment of a field-effect semiconductor device, the field-effect semiconductor device includes a semiconductor body having a first surface. The semiconductor body includes an edge delimiting the semiconductor body in a direction substantially parallel to the first surface, an active area, and a peripheral area arranged between the active area and the edge. The field-effect semiconductor device further includes a source metallization arranged on the first surface and a drain metallization. In the active area the semiconductor body further includes a plurality of drift portions of a first conductivity type alternating with compensation regions of a second conductivity type. The drift portions have a first maximum doping concentration and are in Ohmic contact with the drain metallization. The compensation regions are in Ohmic contact with the source metallization. In the peripheral area the semiconductor body further includes a first edge termination region, and a second semiconductor region in Ohmic contact with the drift portions and having a second maximum doping concentration of dopants of the first conductivity type which is lower than the first maximum doping concentration of the drift portions by a factor of at least five. The first edge termination region is of the second conductivity type, in Ohmic contact with the source metallization and adjoins the second semiconductor region.

According to an embodiment of a field-effect semiconductor device, the field-effect semiconductor device includes a semiconductor body having a first surface. A source metallization is arranged on the first surface. The semiconductor body includes an active area and a peripheral area surrounding the active area. In the active area the semiconductor body further includes a plurality of alternating n-type drift portions and p-type compensation regions. The drift portions have a first maximum doping concentration. The compensation regions are in Ohmic contact with the source metallization. The semiconductor body further includes an edge termination region and a second semiconductor region in Ohmic contact with the drift portions, extending in the peripheral area to the first surface and having a second maximum doping concentration of n-type dopants lower than the first maximum doping concentration. The edge termination region is in Ohmic contact with the source metallization and adjoins the second semiconductor region. A concentration of p-type dopants in the edge termination region varies in a vertical direction substantially orthogonal to the first surface.

According to an embodiment of a field-effect semiconductor device, the field-effect semiconductor device includes a semiconductor body having a first surface. The semiconductor body includes an edge delimiting the semiconductor body in a direction substantially parallel to the first surface, an active area, and a peripheral area arranged between the active area and the edge. The semiconductor device further includes a source metallization arranged on the first surface, and a drain metallization. In a vertical cross-section substantially orthogonal to the first surface, the semiconductor body further includes: a plurality of alternating first n-type pillar regions and first p-type pillar regions arranged in the active area; at least one second p-type pillar region arranged in the peripheral area; and at least one second n-type pillar region arranged between the at least one second p-type pillar region and the first p-type pillar regions. The first n-type pillar regions are in Ohmic contact with the drain metallization. An integrated dopant concentration of the first n-type pillar regions substantially matches an integrated dopant concentration of the first p-type pillar regions. The first p-type pillar regions are in Ohmic contact with the source metallization. The at least one second p-type pillar region is in Ohmic contact with the source metallization and has an integrated dopant concentration smaller than the integrated dopant concentration of the first p-type pillar regions divided by the number of first p-type pillar regions. The at least one second n-type pillar region has an integrated dopant concentration smaller than the integrated dopant concentration of the first n-type pillar regions divided by the number of the first n-type pillar regions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6 illustrates a vertical cross-section through the semiconductor body of a semiconductor device according to an embodiment; and FIG. 7 illustrates a horizontal cross-section through the semiconductor body of the semiconductor device illustrated in FIG. 6 according to an embodiment.

DETAILED DESCRIPTION

Figure 1:
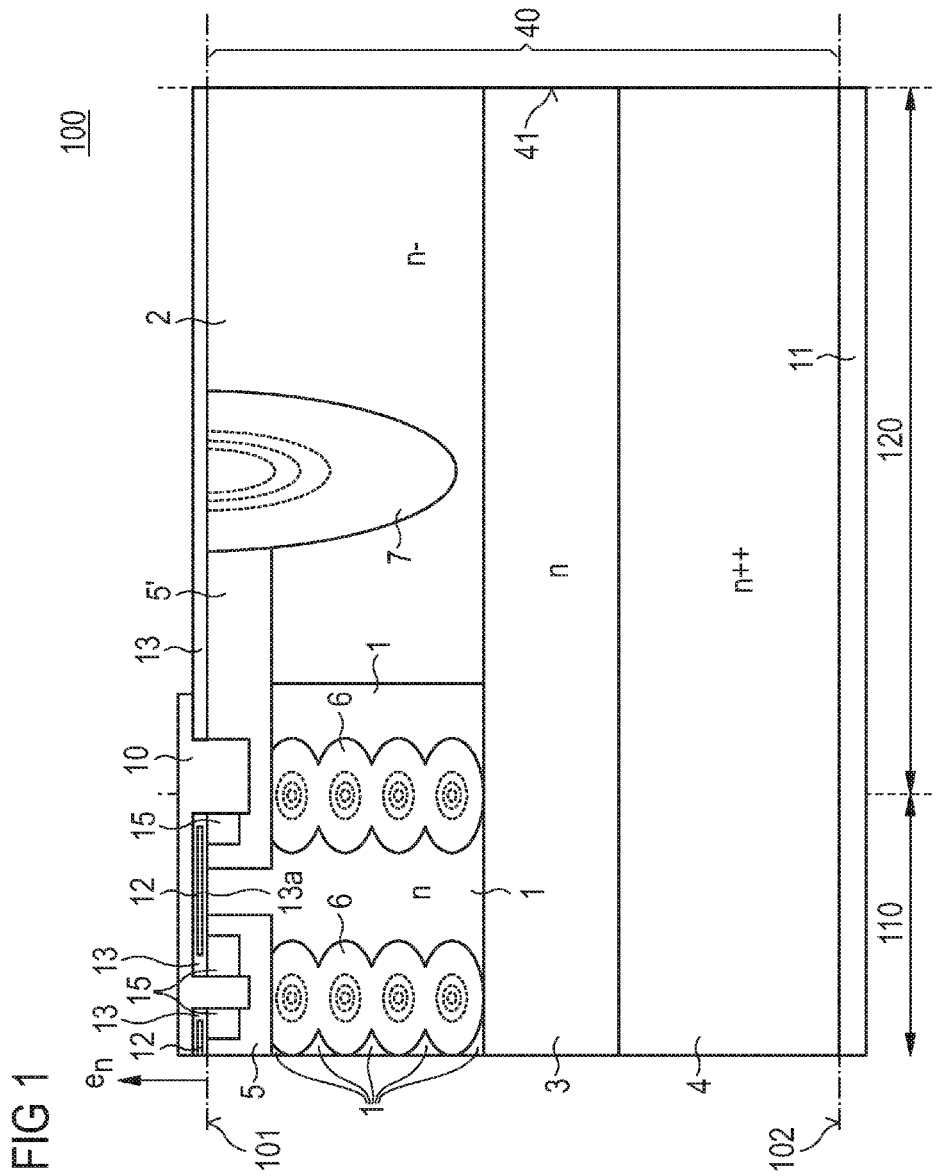
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101, facing a vertical direction en, and a second surface 102 arranged opposite to the first surface 101. In a horizontal direction that is substantially parallel to the first surface 101, the semiconductor body 40 is delimited by an edge 41, for example a sawing edge. The semiconductor body has an active area 110 and a peripheral area 120 arranged between the active area and the edge 41. Typically, the peripheral area 120 surrounds the active area 110 when seen from above.

A source metallization 10 is arranged on the first surface 101. A drain metallization 11 is arranged on the second surface 102, i.e. opposite to the source metallization 10. Furthermore, a gate electrode 12 is typically also arranged on the first surface 101 and insulated from the source metallization 10 and the semiconductor body 40 by a dielectric region 13. The gate electrode 12 is connected to a gate metallization that is not shown in FIG. 1. Accordingly, the semiconductor device 100 may be operated as a three-terminal device.

The semiconductor body 40 typically includes a bulk mono-crystalline material 4 and at least one epitaxial layer 3, 2, 1 formed thereon. Using the epitaxial layer(s) 3, 2, 1 provides more freedom in tailoring the background doping of the material since the doping concentration can be adjusted during deposition of the epitaxial layer or layers.

In the exemplary embodiment illustrated in FIG. 1, the semiconductor body 40 includes a highly doped n-type drain region 4 that extends to the second surface 102 and is in Ohmic contact with the drain metallization 11 and with an n-type field-stop region 3 that adjoins the drain region 4 and has a lower maximum doping concentration than the drain region 4. The drain region 4 and the optional field-stop region 3 are typically arranged in the active area 110 and the peripheral area 120 and may extend to the edge 41.

In the active area 110, a plurality of alternating n-type drift portions 1 and p-type compensation regions 6 forming respective pn-junctions with each other are arranged. The drift portions 1 have a first maximum doping concentration, which is typically higher than the maximum doping concentration of the field-stop region 3. The drift portions 1 are in Ohmic contact with the drain metallization 11 (in the exemplary embodiment via the adjoining field-stop region 3 and the drain region 4), and typically extend to the first surface 101. For sake of clarity, only three drift portions 1 and two compensation regions 6 are illustrated in FIG. 1.

An (mathematically) integrated dopant concentration of the drift portions 1 substantially matches an integrated dopant concentration of the compensation regions 6. Accordingly, the drift portions 1 and the compensation regions 6 form a pn-compensation structure 1, 6. The mean dopant concentration of the drift portions 1 and compensation regions 6, i.e., the mathematically integrated difference of the donor concentration and the acceptor concentration per volume, is typically lower than the maximum doping concentration of the field-stop region 3, more typically lower than the mean doping concentration of the field-stop region 3. Even more typically, the mean dopant concentration of the drift portions 1 and compensation regions 6 is below 10% or below 5% of the maximum dopant concentration of the drift portions 1 and/or the compensation regions 6. Even more typically, the mean dopant concentration of the drift portions 1 and compensation regions 6 is substantially zero.

In the exemplary embodiment, the p-type compensation regions 6 are formed as vertically orientated pillars. Alternatively, the p-type compensation regions 6 are formed as substantially vertically orientated strip-type parallelepipeds, rectangles or ellipsoids. In the following, the n-type drift portions 1 and the p-type compensation regions 6 are also referred to as n-type pillar regions 1 and p-type pillar regions 6.

Depending on the manufacturing of the pn-compensation structure 1, 6, the dopant concentration may vary in the drift portions 1 and/or compensation regions 6. This is illustrated in FIG. 1 by the dashed ellipses, which indicate that the concentration of p-type dopants is higher in the center of the four exemplary bubble-shaped portions of each of the compensation regions 6. The compensation regions 6 are in Ohmic contact with the source metallization 10.

Figure 2:
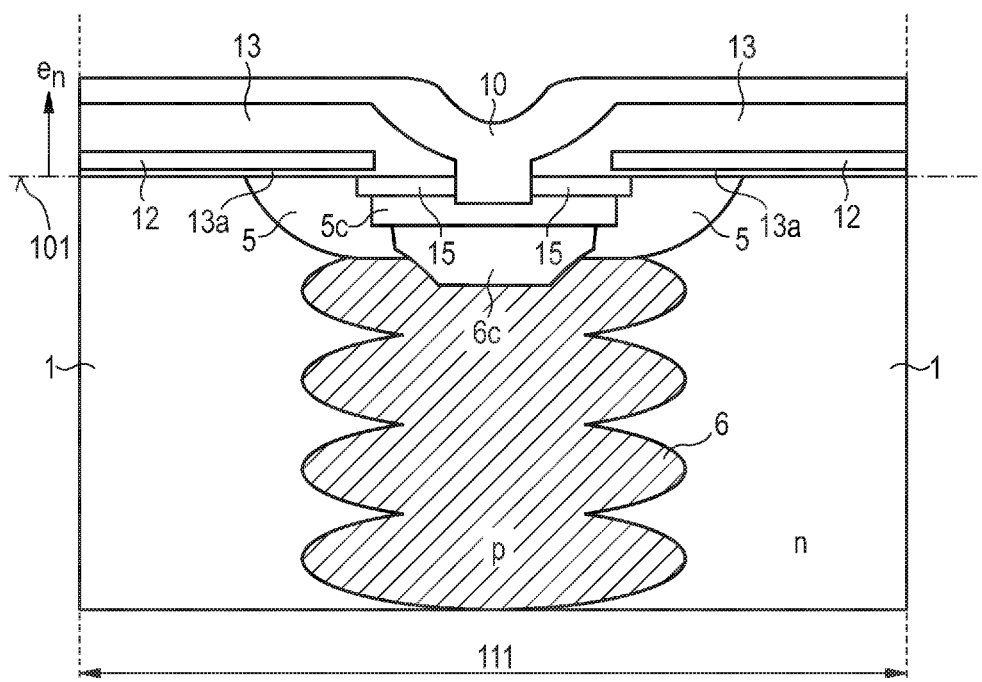
FIG. 2 illustrates a section of the vertical cross-section through the semiconductor device illustrated in FIG. 1 according to an embodiment.

This is explained in more detail with regard to FIG. 2 illustrating an enlarged upper section of the semiconductor device 100 illustrated in FIG. 1. The illustrated section of FIG. 2 typically corresponds to an upper part of one of a plurality of unit cells 111 in the active area 110 of the semiconductor device 100.

In the exemplary embodiment, a $p^+$-type body contact region 5c and two $n^+$-type source regions 15 are formed in a p-type body region 5. Further, an optional $p^+$-type contact region 6c extends between the body contact region 5c and the compensation region 6. The body contact region(s) 5c and the contact region(s) 6c are not shown in FIG. 1 and the following Figures for sake of clarity.

A portion 13a of the dielectric region 13 is arranged between the first surface 101 and each of the gate electrodes 12, and extends in a horizontal direction from the drift portion 1 along the body region 5 at least to the source region 15 so that an inversion channel, which is also referred to herein as MOS-channel, may be formed by the field-effect in a channel region of the body region 5 along the portion(s) 13a forming a gate dielectric region. Accordingly, the semiconductor device 100 may be operated as a MOSFET.

The remaining portion of the dielectric region 13 forms an interlayer dielectric between the source metallization 10 and gate electrode 12 and first surface 101, respectively.

In the exemplary embodiment, the source metallization 10 is electrically contacted with the source regions 15 and the body contact region 5c via a shallow trench contact formed through the interlayer dielectric 13 and into the semiconductor body 40. In other embodiments, the source metallization 10 electrically contacts the source region 15 and the body contact region 5c substantially at the first surface 101.

According to another embodiment, the gate electrode(s) 12 and gate dielectric(s) 13a may be formed in a respective trench extending from the first surface 101 into the semiconductor body 40. In this embodiment, the body region 5 and source regions 15 adjoin an upper part of the respective trench while the drift portions 1 adjoin a lower part of the respective trench. In this embodiment, the drift portions 1 may not extend to the first surface 101 in the active area 110. Referring again to FIG. 1, further embodiments are explained.

According to an embodiment, the doping concentrations of the p-type compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

As illustrated in FIG. 1, the interlayer dielectric 13 typically also covers the semiconductor body 40 in the peripheral area 120. The interlayer dielectric 13 may substantially extend to the edge 41.

In the exemplary embodiment, the drift portion 1 that is closest to the edge 41 does not contribute or does not significantly contribute to the forward current of the MOSFET 100 and is therefore not attributed to the active area 110. The active area 110 may be defined by the presence of source regions 15 and insulated gate electrodes 12.

According to an embodiment, the semiconductor body 40 further includes a p-type edge termination region 7 in Ohmic contact with the source metallization 10 (for example via a horizontal extension portion of the body region 5') and a second semiconductor region 2, which is in Ohmic contact with the drift portions 1, which extends in the peripheral area 120 to the first surface 101, and which has a second maximum doping concentration of n-type dopants lower than the first maximum doping concentration of the drift portions 1 and typically lower than the maximum doping concentration of the field-stop region 3. The p-type edge termination region 7 adjoins the second semiconductor region 2 and has a concentration of p-type dopants which varies in a vertical direction.

The second maximum doping concentration of n-type dopants is typically lower than the first maximum doping concentration by at least a factor of five, more typically by at least a factor of about ten, even more typically by a factor of at least about 20, even more typically by a factor of at least about 50, for example by a factor of about 100. The second semiconductor region 2 may be an n-type semiconductor region forming a pn-junction with the edge termination region 7. The second semiconductor region 2 may also be a substantially intrinsic semiconductor region.

Accordingly, the compensation MOSFET 100 is provided with an edge-termination that requires less chip area than, for example, an edge-termination without source regions and based on alternating n-type and p-type pillar regions with lower pitch than used in the active area.

The second semiconductor region 2 and the edge termination region 7 typically surround the active area 110 when seen from above.

Further, the second semiconductor region 2 may extend into the active area 110. For example, the second semiconductor region 2 may, in the active area 110, be arranged between the field-stop region 3 and the compensation structure 1, 6.

Typically, the concentration of the p-type dopants is largest at or at least close to the first surface 101. The vertical concentration profile of the p-type dopants may be chosen similar as for a VLD (Variation of Lateral Doping) edge-termination structure in horizontal direction.

In other embodiments, the concentration of p-type dopants is largest in a vertical depth in a range from about 20% to about 50% of the vertical extension of the edge termination region 7. For example, the concentration of p-type dopants may be largest at about a third of the vertical extension of the edge termination region 7.

The edge termination region 7 typically extends from the first surface 101 into the second semiconductor region 2 to a depth that corresponds to about at least 30% of the depth of the compensation regions 6, more typically to about at least 50% of the depth of the compensation regions 6. The edge termination region 7 may even extend deeper into the semiconductor body 40 than the compensation regions 6.

The (mathematically) vertically integrated concentration of the p-type dopants of the edge termination region 7 is typically lower compared to the compensation regions 6 and may be in a range from about $5 \times 10^{11}$ cm$^{-2}$ to about $5 \times 10^{12}$ cm$^{-2}$. The maximum horizontal extension of the edge termination region 7 is typically in a range from about 2 μm to about 20 μm and may differ in a vertical direction from the first surface 101. In other embodiments, the maximum horizontal extension of the edge termination region 7 may occur distant to the first surface 101.

Due to the edge termination region 7, the load of the unit cells of the active area 110 next to the edge 41 in the off-state (blocking mode) may be significantly reduced, since the edge termination region 7 is, at sufficient high integrated doping concentration, only depleted at higher blocking voltage. Accordingly, the reduction of the output capacitance $C_{OSS}$ is delayed and thus the switching softness improved.

Due to the vertically varying concentration of p-type dopants of the edge termination region 7, the maximum of the electric field in the off-state typically occurs in the bulk of the semiconductor body 40 and not at its first surface 101. Accordingly, the impact of surface charges at or on the first surface on the blocking capability is reduced.

Further, high avalanche stability may be achieved due to the vertically varying concentration of p-type dopants of the edge termination region 7.

Even further, the semiconductor device 100 may be provided with two or even more edge termination regions 7 with a vertically varying concentration of p-type dopants. The vertical and/or horizontal extension of the at least two edge termination regions 7 may be substantially identical or differ.

Furthermore, the edge termination region 7 and the compensation structure 1, 6 may be formed in common manufacturing processes. For example, several alternating epitaxial depositions and masked p-implantations followed by a common drive-in may be used to form the compensation structure 1, 6. To manufacture the edge termination region 7 in parallel, only additional openings of the used implantation masks in the peripheral area 120 are required. This is because the (relative) difference of the integrated doping concentration between the compensation regions 6 and the edge termination region 7 may be set by the areas of the openings in the implantation mask. In other embodiments, the edge termination region 7 and the compensation structure 1, 6 may be formed in common manufacturing processes by filling differently wide and differently deep trenches with p-doped semiconductor material, e. g., using an epitaxial deposition of semiconductor material.

As illustrated in FIG. 1, the concentration of p-type dopants may, in a vertical cross-section, be substantially mirror symmetrical with respect to a central vertical axis of the edge termination region 7, as indicated by the dashed lines in the edge termination region 7 corresponding to equi-concentration lines.

Figure 3:
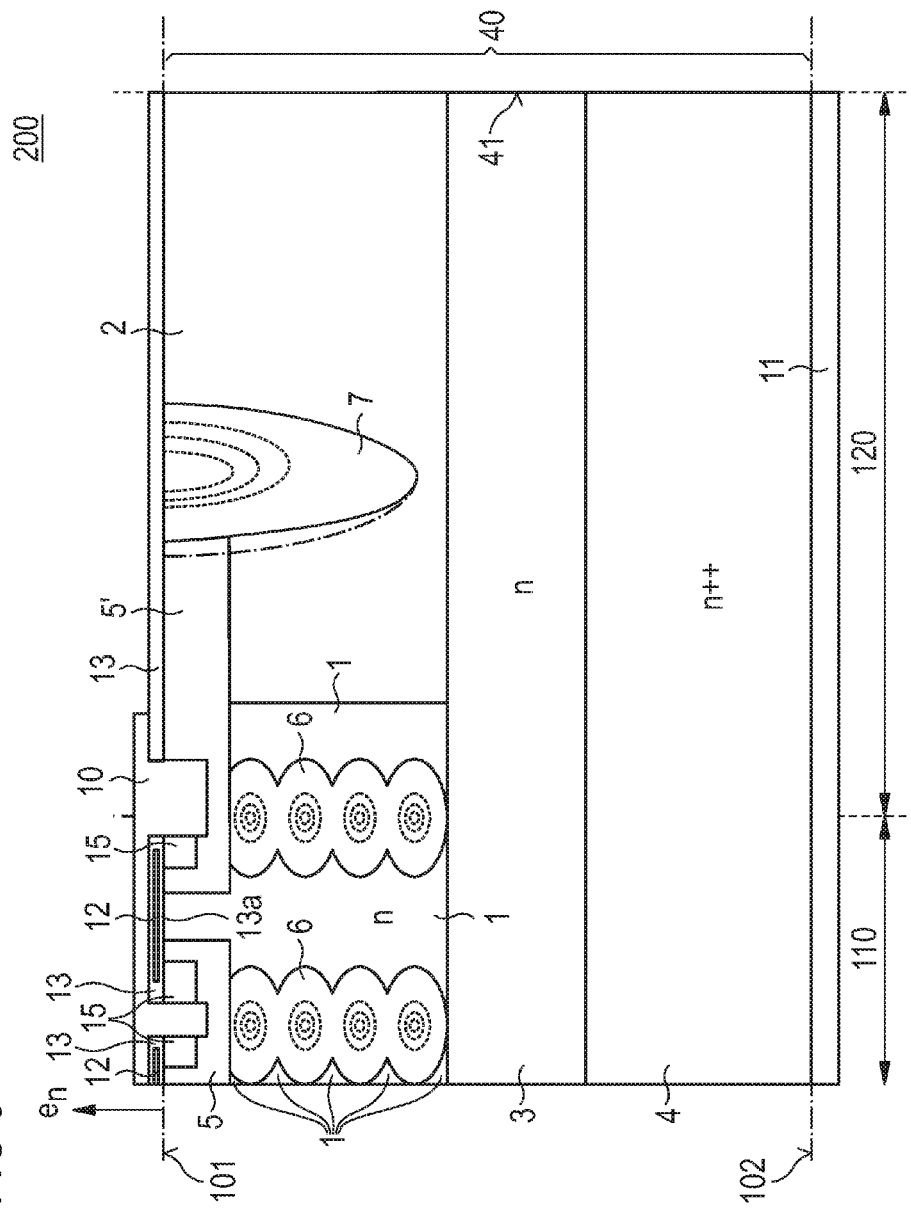
FIG. 3 illustrates a vertical cross-section through a semiconductor body of a semiconductor device according to an embodiment.

FIG. 3 illustrates a vertical cross-section through a field-effect semiconductor device 200. The semiconductor device 200 is similar to the semiconductor device 100 explained above with regard to FIGS. 1 and 2. However, the concentration of p-type dopants of the edge termination region 7 of semiconductor device 200 is, in the vertical cross-section, not mirror-symmetrical. In the exemplary embodiment illustrated in FIG. 3, the concentration of p-type dopants has, along at least one horizontal line crossing the edge termination region 7 and in at least one horizontal cross-section, respectively, a maximum value and a steeper gradient towards the active area 110 compared to the opposite direction. Accordingly, the edge termination region 7 and thus the peripheral area 120 of semiconductor device 200 may have an even smaller horizontal extension resulting in further reduced device costs. The dashed-dotted line in FIG. 3 corresponds to the inner interface between the edge termination region 7 and the second semiconductor region and the body region 5, respectively, in FIG. 1.

Non-mirror-symmetric edge termination region 7 may be manufactured in a similar manner as mirror-symmetric one, by using an implantation mask that is suitably slotted in the peripheral area 120.

Figure 4:
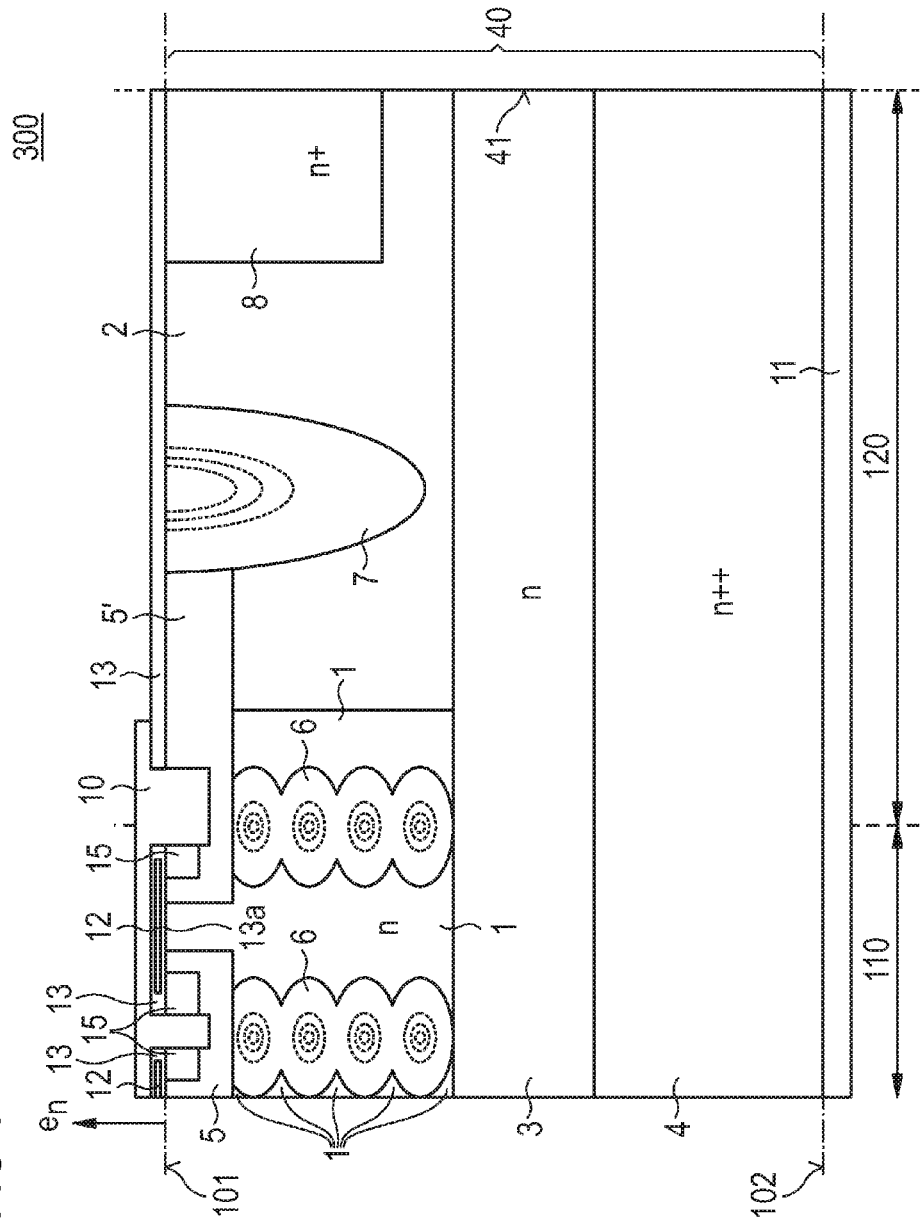
FIG. 4 illustrates a vertical cross-section through a semiconductor body of a semiconductor device according to an embodiment.

FIG. 4 illustrates a vertical cross-section through a field-effect semiconductor device 300. The semiconductor device 300 is similar to the semiconductor device 100 explained above with regard to FIGS. 1 and 2. However, the semiconductor body 40 of the semiconductor device 200 further includes an n-type channel-stop region 8 adjoining the second semiconductor region 2 and having a maximum doping concentration that is higher than the second maximum doping concentration of the second semiconductor region 2. Typically, the channel-stop region 8 extends to the first surface 101 and is arranged between the edge 41 and the edge termination region 7. The channel-stop region 8 may extend substantially to the edge 41. In other embodiments, the channel-stop region 8 may extend in a vertical direction from the first surface 101 to the field-stop region 3 or even to the drain region 4.

Due to the channel-stop region 8, the electric field in the off-state does not, or at least almost does not, extend to the edge 41. Accordingly, a low leakage current is ensured, as crystal defects which may be caused by sawing are shielded by the highly doped channel-stop region 8.

Figure 5:
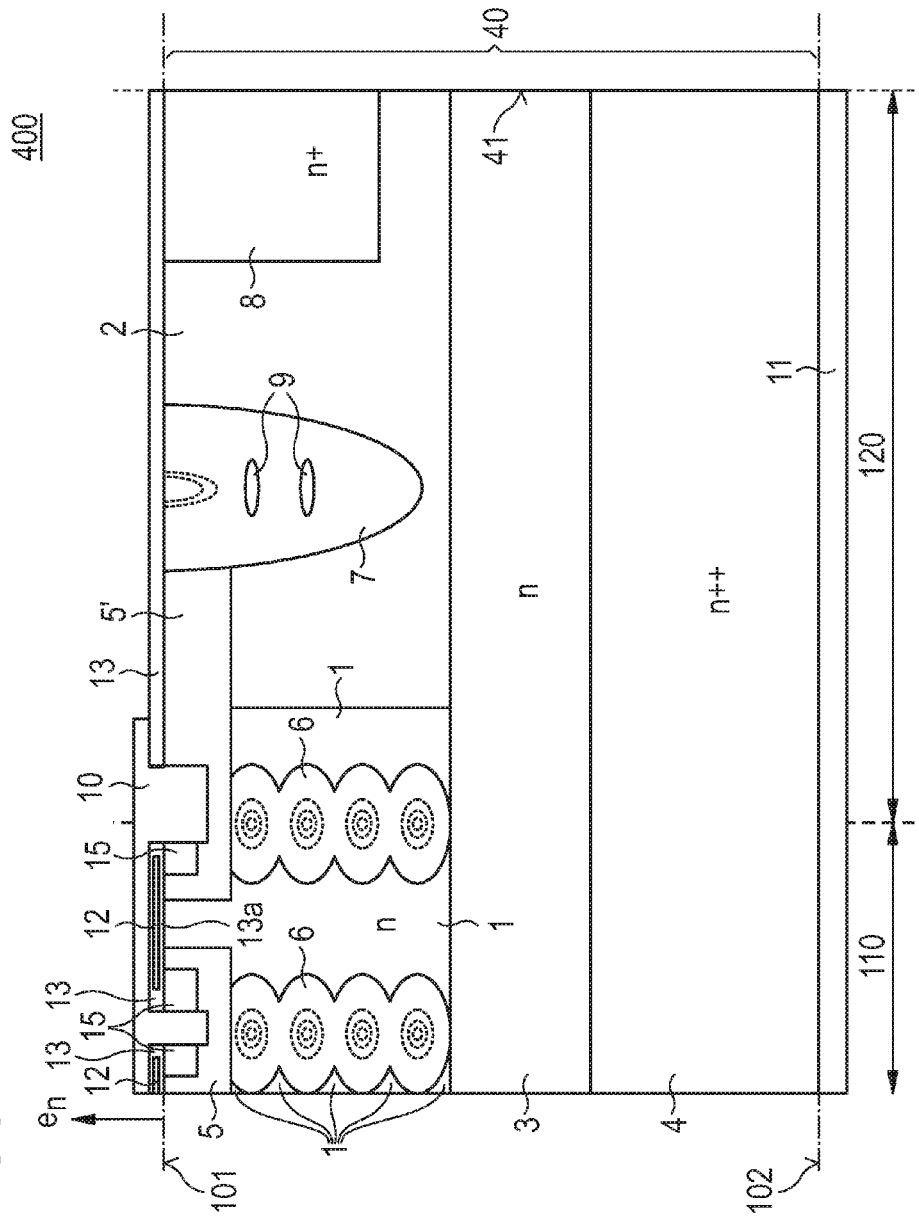
FIG. 5 illustrates a vertical cross-section through a semiconductor body of a semiconductor device according to an embodiment.

FIG. 5 illustrates a vertical cross-section through a field-effect semiconductor device 400. The semiconductor device 400 is similar to the semiconductor device 300 explained above with regard to FIG. 4. However, two exemplary n-type floating semiconductor regions 9 are completely embedded in the edge termination region 7 of semiconductor device 400. The one or more n-type floating semiconductor regions 9 are typically arranged within the edge termination region 7 such that a space charge region formed during the off-state reaches the respective pn-junction formed with the edge termination region 7.

The doping concentration of the one or more n-type floating semiconductor regions 9 may be in a range from about $10^{15}$ cm$^{-3}$ to about $10^{17}$ cm$^{-3}$. Accordingly, an avalanche multiplication may occur in the space charge region at the pn-junctions within the edge termination region 7 already at a comparatively low blocking voltage. The resulting hole-current typically improves the softness during hard commutating.

FIG. 6 illustrates a vertical cross-section through a field-effect semiconductor device 500. The active area 110 of the field-effect semiconductor device 500 is similar to the active area of the semiconductor device 100 explained above with regard to FIGS. 1 and 2 and also includes a compensation structure formed by a plurality of alternating first n-type pillar regions (drift portions) 1 and first p-type pillar regions (compensation regions) 6. The first p-type pillar regions 6 are in Ohmic contact with the source metallization 10 and the first n-type pillar regions 1 are in Ohmic contact with the drain metallization 11 arranged opposite. An integrated dopant concentration of the first n-type pillar regions 1 substantially matches an integrated dopant concentration of the first p-type pillar regions 6. The dashed ellipses within the first n-type pillar regions 1 and the first p-type pillar regions 6 indicate optional sub-regions having a higher n-type dopant concentration and a higher p-type dopant concentration, respectively.

However, the semiconductor body 40 of the semiconductor device 500 further includes a second p-type pillar region 6' in Ohmic contact with the source metallization 10 and a second n-type pillar region 1' that is arranged between and forms respective pn-junctions with the second p-type pillar region 6' and the outermost first p-type pillar regions 6. The dashed ellipses within the second n-type pillar regions 1' and the second p-type pillar regions 6' indicate optional sub-regions having a higher n-type dopant concentration and a higher p-type dopant concentration, respectively. The second p-type pillar region 6' is arranged in the peripheral area 120 and has an integrated dopant concentration smaller than the integrated dopant concentration of the first p-type pillar regions 6 divided by the number of the first p-type pillar regions 6. The second n-type pillar region 1' has an integrated dopant concentration smaller than the integrated dopant concentration of the first n-type pillar regions 1 divided by the number of the first n-type pillar regions 1. The second n-type pillar region 1' may or may not contribute to the forward current. Accordingly, the gate electrode 12 arranged above the second n-type pillar region 1' is only optional. Depending on its contribution to the forward current, the second n-type pillar region 1' is attributed to the active area 110 and peripheral area 120, respectively. The body region 5' arranged between the second p-type pillar region 6' and the source metallization 10 does not include a source region or includes a source region which is surrounded by a sufficient amount of p-dopants to inhibit the forming of an electron channel and is therefore arranged in the peripheral area 120. The second n-type pillar region 1' and the second p-type pillar region 6' may also be considered as forming a transitional area or zone between the active area 110 and peripheral area 120.

Due to the reduced doping of the second n-type pillar region 1' and the second p-type pillar region 6' compared to the compensation structure 1, 6, the potential drop across the second n-type pillar region 1' and the second p-type pillar region 6' is also lower during the off-state (blocking mode). Accordingly, any avalanche breakdown is expected to occur in the active area 110 only. Due to the larger area of the active area 110 compared to the peripheral area 120, the semiconductor device 500 tolerates higher avalanche currents and avalanche energies, respectively, without damaging.

For applications with rare or none avalanche events, such as in resonant circuits, the transitional area may be omitted to further reduce the area of the peripheral area 120.

In the peripheral area 120, the semiconductor body 40 includes: an n-type second semiconductor region 2 that adjoins the second p-type pillar region 6' and has a second maximum doping concentration lower than a first maximum doping concentration of the second n-type pillar region 1'; a p-type first edge termination region 17 adjoining the second semiconductor region 2; and an n-type second edge termination region 18. The second maximum doping concentration of n-type dopants is typically lower than a first maximum doping concentration of the first n-type pillar regions 1 by at least a factor of five, more typically by at least a factor of ten, for example, by a factor of about 50 or of about 100. Due to the low concentration of n-type dopants in the second semiconductor region 2, the contribution of the second semiconductor region 2 to the total output charge $Q_{OSS}$ is very low.

The n-type second edge termination region 18 has a fourth maximum doping concentration higher than the second maximum doping concentration, adjoins the first edge termination region 17, and is at least partly arranged between the first edge termination region 17 and the first surface 101. Typically, a vertically integrated dopant concentration of the n-type second edge termination region 18 matches or is lower than a vertically integrated dopant concentration of the p-type second edge termination region 17.

The output charge $Q_{OSS}$ of the peripheral area 120 is mainly determined by the n-type second edge termination region 18, the p-type first edge termination region 17 and the second p-type pillar region 6' but significantly lower than for edge-termination structures based on compensated inactive alternating n-type and p-type pillar regions extending into the peripheral area 120.

In the exemplary embodiment illustrated in FIG. 6, the p-type first edge termination region 17 is in Ohmic contact with the source metallization 10.

In another embodiment, the first edge termination region 17 is a floating semiconductor region. In this embodiment, the semiconductor device 500 is typically designed such that a space charge region expanding from the pn-junction formed between the n-type second semiconductor region 2 and the second p-type pillar region 6' reaches the first edge termination region 17 and the pn-junction formed between the n-type second semiconductor region 2 and the first edge termination region 17, respectively, already at a low reverse voltage of for example at most 5% or 10% of the rated blocking voltage.

The first edge termination region 17 typically acts as a JTE (Junction Termination Extension)-region and is in the following also referred to as JTE-region 17. The p-type dopant concentration in the JTE region 17 may be constant or decreasing continuously or in discrete steps with decreasing distance from the edge 41. The latter is indicated in FIG. 6 by the two portions 17a, 17b of the JTE-region 17. Correspondingly, the n-type dopant concentration in the n-type second edge termination region 18 may be constant or decreasing continuously or in discrete steps with decreasing distance from the edge 41. The latter is indicated in FIG. 6 by the two portions 18a, 18b of the n-type second edge termination region 18. The n-type second edge termination region 18 stabilizes the edge-termination structure against surface charges on the first surface 101 and reduces the injection of holes into the dielectric region 13.

Further and similar as explained above with regard to FIG. 4, an n-type channel-stop region 8 having a third maximum doping concentration higher than the second maximum doping concentration adjoins the second semiconductor region 2 and may extend to the edge 41 for reducing the leakage current. In other embodiments, the channel-stop region 8 may extend in a vertical direction from the first surface 101 to the field-stop region 3 or even to the drain region 4.

In the exemplary embodiment illustrated in FIG. 6, the semiconductor device 500 further includes a field plate 12a in Ohmic contact with the gate electrodes 12 and a gate metallization (not shown in FIG. 6), respectively, and a field plate 11a in Ohmic contact with the drain metallization 12. Accordingly, the electric field distribution in the off-state may be further smoothed and/or the sensitivity of the semiconductor device 500 with respect to mobile charges in the dielectric region 13 be further reduced.

The field plate 11a is typically arranged close to the edge 41. The field plate 11a is typically arranged between the field plate 12a and the source metallization 10.

The field plate 11a and/or the field plate 12a may be stepped as illustrated in FIG. 6, i.e., the vertical (minimum) distance of the field plates 11a and/or 12a from the first surface 101 may change substantially stepwise in a horizontal direction. The number of steps may also be higher or lower compared to the exemplary embodiment illustrated in FIG. 6. In other embodiments, only one or even none of the field plate 11a, 12a is arranged on the first surface 101.

FIG. 7 illustrates an edge section of a horizontal cross-section through the semiconductor body 40 of the semiconductor device 500 illustrated in FIG. 6 beneath the JTE-region 17. Typically, the active area 110 is surrounded by a contiguous channel-stop region 8 when viewed from above. The boundary between the active area 110 and the peripheral area 120 is indicated by dashed lines in FIG. 7. For sake of clarity, only four first p-type pillar regions 6 of active area 110 are illustrated in FIG. 7. FIG. 6 typically corresponds to a cross-section along line 501 defining an x-direction. As illustrated in FIG. 7, the first p-type pillar regions 6 and the first n-type pillar regions 1 typically adjoin the second p-type pillar regions 6'. In this embodiment, the active area 110 is typically surrounded by a contiguous second p-type pillar region 6' when viewed from above.

The minimum distance $d_y$ in y-direction (elongation direction of the regions 1, 1', 6 in horizontal cross-sections) between the second semiconductor region 2 and the first n-type pillar regions 1 and the first p-type pillar regions 6, respectively, may be equal to but also smaller than the maximum distance in x-direction $d_x$ of about 20 μm, between the second n-type pillar region 1' and the second semiconductor region 2. For example, the ratio $d_y/d_x$ may be smaller than about 0.8 or even 0.5. Typically, the minimum distance $d_y$ in y-direction between the second semiconductor region 2 and the first n-type pillar regions 1 substantially equals the minimum distance in y-direction between the second semiconductor region 2 and the second n-type pillar regions 1'.

In another embodiment, the first and second n-type pillar regions 1, 1' extend in the y-direction at least to the second semiconductor region 2. This is illustrated in FIG. 7 by the dashed-dotted curves. In this embodiment, the first p-type pillar regions 6 typically adjoin the second semiconductor region 2 and the second p-type pillar region 6' does not adjoin the first p-type pillar regions 6. Note that the drop of the electric potential during the blocking-mode of the semiconductor device 500 is typically different for the x-direction and the y-direction, due to the geometry and the arrangement of the pillar regions 1, 6 in the active area 110. The peripheral area 120 may be formed accordingly.

Furthermore, the first and second n-type pillar regions 1, 1' may have a reduced and/or decreasing extension in x-direction close to the second semiconductor region 2.

Further, the concentration of dopants is typically reduced in y-direction close to and towards the second semiconductor region 2.

Referring again to FIG. 6, further embodiments are explained. Typically, the integrated absolute dopant concentration of the second p-type pillar region 6' is smaller than the integrated absolute dopant concentration of the second n-type pillar region 1', which is smaller than the integrated absolute dopant concentration of the first p-type pillar regions 6 substantially matching the integrated absolute dopant concentration of the first n-type pillar region 1.

Typically, the integrated concentration of p-type dopants in the second p-type pillar region 6' is smaller than the integrated concentration of n-type dopants in the second n-type pillar region 1' by a factor of about 2.

The integrated dopant concentration of the second n-type pillar region 1' is typically in a range from about 50% to about 99% of the integrated dopant concentration of the first n-type pillar region 1.

The integrated dopant concentration of the second p-type pillar region 6' is typically in a range from about 25% to about 60% of the integrated dopant concentration of the first p-type pillar region 6.

In further embodiments, more than one pair of second pillar regions 1', 6' is used, typically with decreasing integrated dopant concentration towards the edge. In further embodiments, the integrated dopant concentrations of the second p-type pillar regions 6' and of the second n-type pillar regions 1' decrease with an increasing distance from the active area 110 in a lateral direction.

According to numerical simulations of the semiconductor device 500 illustrated in FIG. 6, the corrugation of the electric potential in the second p-type pillar region 6' is reduced compared to the first pillar regions 1, 6. Accordingly, avalanche multiplication will occur only in the active area 110 as affirmed by analyzing the corresponding generation of charge carriers. According to the simulations, the horizontal extension of the peripheral area 120 of the semiconductor device 500 could even further be reduced. This would result in an even lower product of $R_{on}$ times $Q_{oss}$.

The field-effect semiconductor device 500 may also be described as a semiconductor device 500 having a semiconductor body 40 including a first surface 101, an edge 41 delimiting the semiconductor body 40 in a direction substantially parallel to the first surface 101, an active area 110, and a peripheral area 120 arranged between the active area 110 and the edge 41. A source metallization 10 is arranged on the first surface, and a drain metallization 11 is arranged opposite to the source metallization 10. In the active area 110, the semiconductor body 40 further includes a plurality of alternating n-type drift portions 1 and p-type compensation regions 6, the drift portions 1 having a first maximum doping concentration and being in Ohmic contact with the drain metallization 11. The compensation regions 6 are in Ohmic contact with the source metallization 10. The semiconductor body 40 further includes a second semiconductor region 2 in Ohmic contact with the drain metallization 11 and having a second maximum doping concentration of dopants of the first conductivity type that is lower than the first maximum doping concentration. In the peripheral area 120, the semiconductor body 40 further includes: a p-type first edge termination region 17 adjoining the second semiconductor region 2, and an n-type second edge termination region 18 having a fourth maximum doping concentration higher than the second maximum doping concentration, adjoining the first edge termination region 17, and being arranged at least partly between the first edge termination region 17 and the first surface 101.

The field-effect semiconductor devices explained above with regard to the above Figures have in common that they include a semiconductor body 40 having a first surface 101, an edge 41 delimiting the semiconductor body 40 in a direction substantially parallel to the first surface 101, an active area 110, and a peripheral area 120 arranged between the active area 110 and the edge 41. A source metallization 10 is arranged on the first surface 101 and a drain metallization 11 is arranged opposite to the source metallization 10. In the active area 110, the semiconductor body 40 further includes: a plurality of drift portions 1 of a first conductivity type alternating with compensation regions 6 of a second conductivity type. The drift portions 1 have a first maximum doping concentration and are in Ohmic contact with the drain metallization 11. The compensation regions 6 are in Ohmic contact with the source metallization 10. In the peripheral area 120 the semiconductor body 40 further includes: a second semiconductor region 2 in Ohmic contact with the drift portions 1 and having a second maximum doping concentration of dopants of the first conductivity type which is lower than the first maximum doping concentration of the drift portions 1 by a factor of at least five, more typically by a factor of at least ten; and a first edge termination region 7, 17 of the second conductivity type in Ohmic contact with the source metallization 10 and adjoining the second semiconductor region 2.

Typically, an integrated dopant concentration of the drift portions 1 in the active area 110 substantially matches an integrated dopant concentration of the compensation regions 6 in the active area 110.

The first edge termination region 7, 17 and the second semiconductor region 2 may form a pn-junction.

Typically, the second maximum doping concentration is lower than the first maximum doping concentration by at least a factor of fifty.

According to an embodiment, the semiconductor body 40 further includes, in the peripheral area 120, a channel-stop region 8 of the first conductivity type, which has a third maximum doping concentration higher than the second maximum doping concentration, is in Ohmic contact with the second semiconductor region 2, and is arranged between the edge 41 and at least one of the first edge termination region 7, 17 and the second semiconductor region 2.

According to an embodiment, the semiconductor body 40 further includes a second edge termination region 18 of the first conductivity type having a fourth maximum doping concentration higher than the second maximum doping concentration in the peripheral area 120. The second edge termination region 18 is in Ohmic contact with the drain metallization 11, adjoins the first edge termination region 17, and is arranged between the first edge termination region 17 and the first surface.

Typically, the second edge termination region 18 includes a first portion 18a and a second portion 18b that has a lower maximum doping concentration than the first portion 18a and is arranged between the first portion 18a and the edge 41.

Likewise, the first edge termination region 17 typically includes a first portion 17a and a second portion 17b that has a lower integrated doping concentration than the first portion 17a and is arranged between the first portion 17a and the edge 41.

According to an embodiment, a concentration of dopants of the second conductivity type is, in a vertical direction, varied in the first edge termination region 7 such that the concentration is largest at least close to the first surface 101.

At least one floating semiconductor region 9 of the first conductivity type may be completely embedded in the first edge termination region 7.

According to an embodiment, the semiconductor body 40 includes, in the peripheral area 120, a further compensation region 6' of the second conductivity type in Ohmic contact with the source metallization 10, wherein the semiconductor body 40 further includes a semiconductor portion 1' forming a pn-junction with the further compensation regions 6' and a further pn-junction one of the compensation regions 6, wherein an integrated dopant concentration of the semiconductor portion 1' is smaller than the integrated dopant concentration of the drift portions 1 divided by the number of the drift portions 1, and wherein an integrated dopant concentration of the further compensation region 6' is smaller than the integrated dopant concentration of the semiconductor portion 1' and/or smaller than the integrated dopant concentration of the compensation regions 6 divided by the number of the compensation regions.

According to an embodiment, the field-effect semiconductor further includes an dielectric region 13 arranged on the first surface 101, a field plate 11a arranged on the first surface 101 and in ohmic contact with the drain metallization 11, and/or a field plate 12a arranged on the first surface 101 and in ohmic contact with the gate metallization or the source metallization 10 arranged on the first surface 101.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A field-effect semiconductor device, comprising:
   a semiconductor body comprising a first surface, an edge delimiting the semiconductor body in a direction substantially parallel to the first surface, an active area, and a peripheral area arranged between the active area and the edge;
   a source metallization arranged on the first surface; and
   a drain metallization,
   in the active area the semiconductor body further comprising:
      a plurality of drift portions of a first conductivity type alternating with compensation regions of a second conductivity type, the drift portions comprising a first maximum doping concentration and being in Ohmic contact with the drain metallization, the compensation regions being in Ohmic contact with the source metallization,
   in the peripheral area the semiconductor body further comprising:
      a second semiconductor region in Ohmic contact with the drift portions and comprising a second maximum doping concentration of dopants of the first conductivity type, the second maximum doping concentration being lower than the first maximum doping concentration of the drift portions by a factor of at least five;
      a first edge termination region of the second conductivity type in Ohmic contact with the source metallization and adjoining the second semiconductor region, and
      a second edge termination region of the first conductivity type comprising a fourth maximum doping concentration higher than the second maximum doping concentration, the second edge termination region being in Ohmic contact with the drain metallization, adjoining the first edge termination region, and being arranged between the first edge termination region and the first surface.

2. The field-effect semiconductor device of claim 1, wherein the second maximum doping concentration is lower than the first maximum doping concentration by at least a factor of ten.

3. The field-effect semiconductor device of claim 1, wherein the first edge termination region and the second semiconductor region form a pn-junction.

4. The field-effect semiconductor device of claim 1, wherein the semiconductor body further comprises, in the peripheral area, a channel-stop region of the first conductivity type comprising a third maximum doping concentration higher than the second maximum doping concentration, being in Ohmic contact with the second semiconductor region, and being arranged between the edge and at least one of the first edge termination region and the second semiconductor region.

5. The field-effect semiconductor device of claim 1, wherein the second edge termination region comprises a first portion and a second portion that has a higher maximum doping concentration than the first portion and is arranged between the first portion and the edge.

6. The field-effect semiconductor device of claim 1, wherein the first edge termination region comprises a first portion and a second portion that has a lower integrated doping concentration than the first portion and is arranged between the first portion and the edge.

7. The field-effect semiconductor device of claim 1, wherein a concentration of dopants of the second conductivity type is, in a vertical direction substantially orthogonal to the first surface, varied in the first edge termination region, and/or wherein the concentration is largest at least close to the first surface.

8. The field-effect semiconductor device of claim 1, wherein the semiconductor body further comprises at least one floating semiconductor region of the first conductivity type, which floating semiconductor region is completely embedded in the first edge termination region.

9. The field-effect semiconductor device of claim 1, wherein an integrated dopant concentration of the drift portions in the active area substantially matches an integrated dopant concentration of the compensation regions in the active area.

10. The field-effect semiconductor device of claim 1, wherein the semiconductor body comprises in the peripheral area a further compensation region of the second conductivity type in Ohmic contact with the source metallization, wherein the semiconductor body comprises a semiconductor portion forming a pn-junction with the further compensation region and one of the compensation regions, wherein an integrated dopant concentration of the semiconductor portion is smaller than the integrated dopant concentration of the drift portions divided by a number of the drift portions, and wherein an integrated dopant concentration of the further compensation region is smaller than the integrated dopant concentration of the semiconductor portion and/or smaller than the integrated dopant concentration of the compensation regions divided by a number of the compensation regions.

11. The field-effect semiconductor device of claim 1, further comprising at least one of:
    an dielectric region arranged on the first surface;
    a field plate arranged on the first surface and in ohmic contact with the drain metallization; and a field plate arranged on the first surface and in ohmic contact with the source metallization or with a gate metallization arranged on the first surface.

12. A field-effect semiconductor device, comprising:
a semiconductor body comprising a first surface, an active area, and a peripheral area surrounding the active area; and
a source metallization arranged on the first surface,
in the active area the semiconductor body further comprising:
   a plurality of alternating n-type drift portions and p-type compensation regions, the drift portions comprising a first maximum doping concentration, the compensation regions being in Ohmic contact with the source metallization,
the semiconductor body further comprising:
   a second semiconductor region in Ohmic contact with the drift portions, extending in the peripheral area to the first surface and comprising a second maximum doping concentration of dopants of the first conductivity type, the second maximum doping concentration being lower than the first maximum doping concentration; and
   an edge termination region in Ohmic contact with the source metallization, adjoining the second semiconductor region, and having a concentration of p-type dopants which varies in a vertical direction substantially orthogonal to the first surface.

13. The field-effect semiconductor device of claim 12, wherein the concentration of p-type dopants is largest at least close to the first surface.

14. The field-effect semiconductor device of claim 12, wherein the concentration of p-type dopants is, in a vertical cross-section substantially orthogonal to the first surface, substantially mirror-symmetrical with respect to a vertical axis.

15. The field-effect semiconductor device of claim 12, wherein the semiconductor body comprises at least one of:
   an edge delimiting the semiconductor body in a direction substantially parallel to the first surface;
   at least one n-type floating semiconductor region which is embedded in the edge termination region; and
   an n-type channel-stop region comprising a third maximum doping concentration higher than the second maximum doping concentration, in Ohmic contact with the second semiconductor region, and being arranged between the edge and at least one of the edge termination region and the second semiconductor region.

16. A field-effect semiconductor device, comprising:
a semiconductor body comprising a first surface, an edge delimiting the semiconductor body in a direction substantially parallel to the first surface, an active area, and a peripheral area arranged between the active area and the edge;
a source metallization arranged on the first surface, and
a drain metallization,
in a vertical cross-section substantially orthogonal to the first surface the semiconductor body further comprising:
   a plurality of alternating first n-type pillar regions and first p-type pillar regions arranged in the active area, the first n-type pillar regions being in Ohmic contact with the drain metallization, the first p-type pillar regions being in Ohmic contact with the source metallization, and an integrated dopant concentration of the first n-type pillar regions substantially matching an integrated dopant concentration of the first p-type pillar regions;
   at least one second p-type pillar region in Ohmic contact with the source metallization, arranged in the peripheral area and having an integrated dopant concentration smaller than the integrated dopant concentration of the first p-type pillar regions divided by a number of the first p-type pillar regions; and
   at least one second n-type pillar region arranged between the at least one second p-type pillar region and the first p-type pillar regions, directly contacting the first surface, and having an integrated dopant concentration smaller than the integrated dopant concentration of the first n-type pillar regions divided by a number of the first n-type pillar regions.

17. The field-effect semiconductor device of claim 16, wherein the integrated dopant concentration of the at least one second p-type pillar region is smaller than the integrated dopant concentration of the at least one second n-type pillar region.

18. The field-effect semiconductor device of claim 16, wherein the integrated dopant concentration of the at least one second n-type pillar region is in a range from about 50% to about 99% of the integrated dopant concentration of the first n-type pillar regions divided by the number of the first n-type pillar regions.

19. The field-effect semiconductor device of claim 16, further comprising at least one of:
   an edge delimiting the semiconductor body in a direction substantially parallel to the first surface;
   an n-type second semiconductor region adjoining the at least one second p-type pillar region in the peripheral area and comprising a second maximum doping concentration lower than a first maximum doping concentration of the at least one second n-type pillar region;
   a p-type first edge termination region adjoining the second semiconductor region;
   an n-type second edge termination region comprising a fourth maximum doping concentration higher than the second maximum doping concentration, adjoining the first edge termination region, and being arranged between the first edge termination region and the first surface; and
   an n-type channel-stop region comprising a third maximum doping concentration higher than the second maximum doping concentration, being in Ohmic contact with the second semiconductor region and being arranged between the edge and at least one of the first edge termination region and the second semiconductor region.

20. A field-effect semiconductor device, comprising:
a semiconductor body comprising a first surface, an edge delimiting the semiconductor body in a direction substantially parallel to the first surface, an active area, and a peripheral area arranged between the active area and the edge;
a source metallization arranged on the first surface; and
a drain metallization,
in the active area the semiconductor body further comprising:
   a plurality of drift portions of a first conductivity type alternating with compensation regions of a second conductivity type, the drift portions comprising a first maximum doping concentration and being in Ohmic contact with the drain metallization, the compensation regions being in Ohmic contact with the source metallization, in the peripheral area the semiconductor body further comprising:
- a second semiconductor region in Ohmic contact with the drift portions and comprising a second maximum doping concentration of dopants of the first conductivity type, the second maximum doping concentration being lower than the first maximum doping concentration of the drift portions by a factor of at least five; and
- a first edge termination region of the second conductivity type in Ohmic contact with the source metallization and adjoining the second semiconductor region, wherein the first edge termination region comprises a first portion and a second portion that has a lower integrated doping concentration than the first portion and is arranged between the first portion and the edge.

* * * * *